United States Patent
Fujiwara

(10) Patent No.: US 8,582,377 B2
(45) Date of Patent: Nov. 12, 2013

(54) REDUNDANT MEMORY ARRAY FOR REPLACING MEMORY SECTIONS OF MAIN MEMORY

(71) Applicant: Micron Technology, Inc., Boise, ID (US)

(72) Inventor: Yoshinori Fujiwara, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/888,120

(22) Filed: May 6, 2013

(65) Prior Publication Data

US 2013/0254513 A1 Sep. 26, 2013

Related U.S. Application Data

(60) Continuation of application No. 13/430,444, filed on Mar. 26, 2012, now Pat. No. 8,437,208, which is a continuation of application No. 13/013,633, filed on Jan. 25, 2011, now Pat. No. 8,159,890, which is a division of application No. 12/255,523, filed on Oct. 21, 2008, now Pat. No. 7,885,128.

(51) Int. Cl.
G11C 29/00 (2006.01)
(52) U.S. Cl.
USPC ............... 365/200; 365/189.09; 365/230.03
(58) Field of Classification Search
USPC ....................... 365/200, 189.09, 230.03
See application file for complete search history.

(56) References Cited

U.S. PATENT DOCUMENTS

| | | | |
|---|---|---|---|
| 5,914,907 A | 6/1999 | Kobayashi et al. | |
| 6,314,030 B1 | 11/2001 | Keeth | |
| 6,442,084 B2 | 8/2002 | Keeth | |
| 6,545,897 B2 * | 4/2003 | Fujisawa et al. | 365/63 |
| 6,898,110 B2 | 5/2005 | Ishimatsu et al. | |
| 7,423,922 B2 | 9/2008 | Roohparvar | |
| 7,885,128 B2 | 2/2011 | Fujiwara | |
| 8,159,890 B2 | 4/2012 | Fujiwara | |
| 2001/0053101 A1 | 12/2001 | Keeth | |
| 2005/0219922 A1 | 10/2005 | Horiguchi et al. | |
| 2005/0265091 A1* | 12/2005 | Tajima et al. | 365/200 |
| 2007/0070735 A1* | 3/2007 | Lee | 365/200 |
| 2007/0285981 A1 | 12/2007 | Roohparvar | |
| 2008/0205111 A1 | 8/2008 | Kajigaya et al. | |
| 2009/0201753 A1* | 8/2009 | Riho et al. | 365/200 |
| 2010/0097871 A1 | 4/2010 | Fujiwara | |
| 2011/0122715 A1 | 5/2011 | Fujiwara | |
| 2012/0033512 A1 | 2/2012 | Takase | |
| 2012/0182817 A1 | 7/2012 | Fujiwara | |
| 2012/0307578 A1* | 12/2012 | Noguchi | 365/200 |

* cited by examiner

Primary Examiner — Tuan T. Nguyen
(74) Attorney, Agent, or Firm — Dorsey & Whitney LLP

(57) ABSTRACT

Memories and methods for replacing memory sections of a main memory array by mapping memory addresses for an entire main memory section to at least one memory section of a redundant memory array. One such memory includes a fuse block having programmable elements configured to be programmed to identify main memory sections to be mapped to redundant memory sections of the redundant memory array. The memory further includes a redundant memory logic circuit coupled to the redundant memory array and the fuse block. The redundant memory logic is configured to map the memory for a main memory section identified in the fuse block to at least one of the redundant memory sections of the redundant memory array.

20 Claims, 5 Drawing Sheets

REDUNDANT MEMORY ARRAY FOR REPLACING MEMORY SECTIONS OF MAIN MEMORY

CROSS-REFERENCE TO RELATED APPLICATIONS

This application is a continuation of U.S. patent application Ser. No. 13/430,444, filed Apr. 2, 2012, which is a continuation of U.S. patent application Ser. No. 13/013,633, filed Jan. 25, 2011, U.S. Pat. No. 8,159,890, issued Apr. 17, 2012, which is a divisional of U.S. patent application Ser. No. 12/255,523, filed Oct. 21, 2008, U.S. Pat. No. 7,885,128, issued Feb. 8, 2011, which applications and patents are incorporated herein by reference, in their entirety, for any purpose.

TECHNICAL FIELD

Embodiments of the present invention relate generally to semiconductor memory, and more particularly, in one or more of the illustrated embodiments, to semiconductor memory including redundant memory sections for replacement of memory sections of main memory.

BACKGROUND OF THE INVENTION

Semiconductor memory typically includes redundant memory that is used to replace memory of a main memory array. Replacement, that is, mapping memory addresses of the memory to be replaced to redundant memory, most often occurs when some of the memory of the main memory array is defective. By replacing the defective memory with functional redundant memory, the memory can be salvaged rather than discarded.

The main memory array is divided into several sub-parts, for example, into banks of memory, which are further divided into memory sections of the main memory array. In many memory array architectures, a limited amount of redundant memory is provided for each of the memory sections, and can be used only to replace memory in the respective memory section. Unused redundant memory of a memory section cannot be used to replace memory of another memory section that is in need of more redundant memory. Consequently, if the number or arrangement of defective memory of a memory section is such that they cannot be repaired by the limited redundant memory dedicated to that memory section, the entire memory is discarded, or in some instances, downgraded to a memory having less overall capacity. Neither result is as desirable as fully repairing the memory.

FIG. 1 illustrates a portion of a main memory array 100. The main memory array 100 utilizes an "open-digit line" sense amplifier architecture. Open-digit line sense amplifier architectures, as known, have each digit line (of a pair of digit lines coupled to a respective sense-amplifier) extending into a different memory section of the array. FIG. 1 includes more detailed illustrations of two different groups 110, 120 of memory sections. Each group 110, 120 is shown in FIG. 1 as having a central memory section 132, a first adjacent memory section 134, and a second adjacent memory section 136. Additionally, each group 110, 120 includes a first set of sense-amplifiers 142 disposed between the central and first adjacent memory sections 132, 134 and a second set of sense-amplifiers 144 is disposed between the central and second adjacent memory sections 132, 136. Due to the open-digit line architecture, each sense-amplifier of the first set of sense-amplifiers is coupled to one digit line extending into the central memory section 132 and a second digit line extending into the first adjacent memory sections 134, and each sense-amplifier of the second set of sense-amplifiers is coupled to one digit line extending into the central memory section 132 and a second digit line extending into the second adjacent memory section 136.

In an open-digit line architecture, some failure modes result in a block of three adjacent memory sections failing. As previously discussed, each of the memory sections typically have limited redundant memory that can be used to repair several failures in the respective section. In order to minimize the extra area needed for the redundant memory, the amount of redundant memory per memory section is much less than would be needed to repair the entire memory section. If the failure requires more redundant memory than is available for the memory section, the memory section is considered unrepairable. In some instances, the inability to repair will result, as previously mentioned, in a block of three adjacent memory sections failing. For example, with reference to FIG. 1, where several of the digit lines of the central memory section 132, in particular, the digit lines coupled to sense-amplifiers of the first set of sense-amplifiers 142 and of the second set of sense-amplifiers 144, have short circuited to one another, the sense amplifiers of both the first and second sets of sense-amplifiers 142, 144 may be rendered inoperable. Consequently, not only is memory of the central memory section 132 defective but memory of the first and second adjacent memory sections may be defective as well, resulting in three adjacent memory sections failing. This type of catastrophic block failure will typically result in the entire memory device being considered inoperable.

Therefore, there is a need for a redundant memory architecture that can replace memory of entire memory sections and is sensitive to the desire to reduce the additional area used for redundant memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As previously discussed, memory arrays having open digit line sense-amplifier architectures are susceptible to block failures of three adjacent memory sections. Embodiments of the invention include at least one redundant memory array that can be used to replace a memory section of main memory, for example, when the defective memory of a memory section cannot be repaired by the limited redundant memory local to that memory section.

Figure 2:
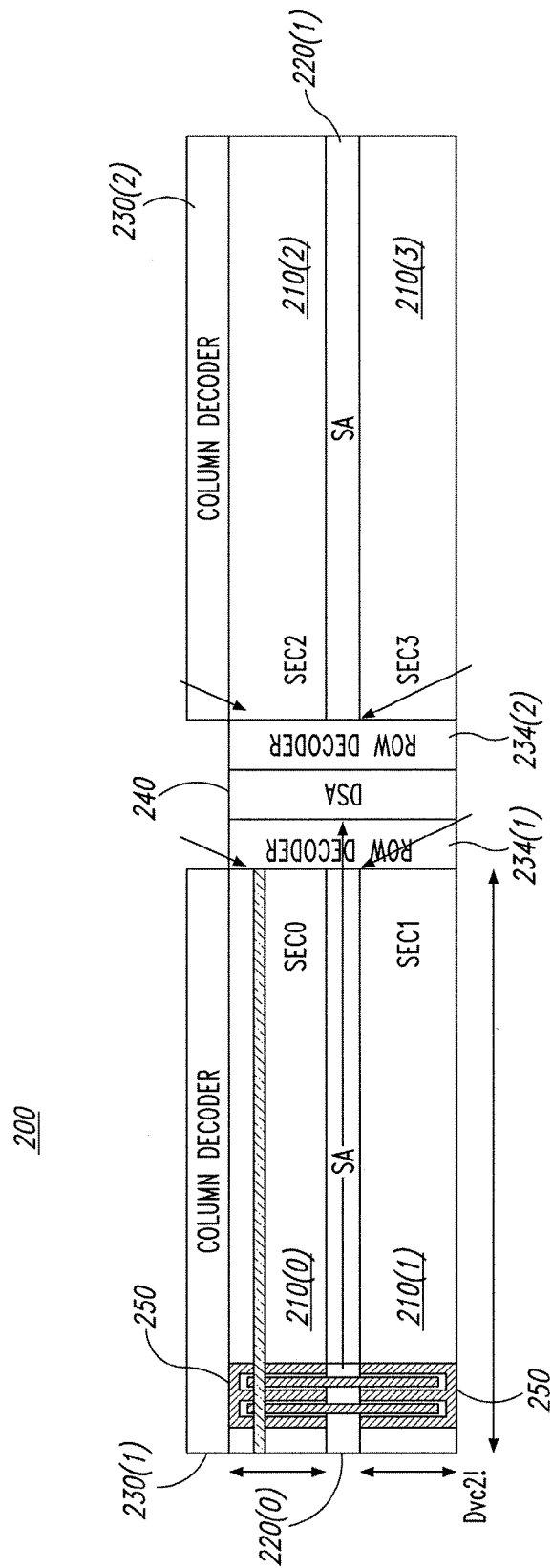
FIG. 2 is a block diagram of a redundant memory array according to some embodiments of the invention.

FIG. 2 illustrates a redundant array of memory 200 according to some embodiments of the invention. The redundant array of memory 200 may be included in a redundant memory architecture according to embodiments of the invention, as will be described in more detail below. The redundant array of memory 200 includes four memory sections 210(0)-210(3). Memory sections 210(0) and 210(1) share a set of sense-amplifiers 220(0) and memory sections 210(2) and 210(3) share a set of sense-amplifiers 220(1). The sense-amplifiers of the sets 220(0), 220(1) have an open-digit line architecture. Column decoder circuits 230(1), 230(2), row decoder circuits 234(1), 234(2), and data sense-amplifiers 240, which can be implemented using circuits and designs known by those ordinarily skilled in the art, are also illustrated in FIG. 2. Operation of the column decoder circuits 230(1), 230(2), row decoder circuits 232(1), 232(2), and data sense-amplifiers 240 is conventional.

In some embodiments, the digit lines of the sense-amplifiers of the sets 220(0), 220(1) are coupled to the same number of memory cells as digit lines for the memory sections of a main memory array. That is, the digit lines extending through the memory sections 210(0)-210(3) are the same "length" as the digit lines extending through the memory sections of the main memory array.

In other embodiments, the digit lines extending through the memory sections 210(1)-210(3) of the redundant memory array 200 are coupled to fewer memory cells than the digit lines extending through the memory sections of main memory array. For example, in some of these embodiments, the digit lines of the sense-amplifiers of the sets 220(0), 220(1) are coupled to approximately half as many memory cells as digit lines for the memory sections of the main memory array. That is, the digit lines extending through the memory sections 210(0)-210(3) are approximately half the length of the digit lines extending through the memory sections of the main memory array. In embodiments having digit lines half as long, two redundant memory arrays 200 are used to repair a block failure having three adjacent memory sections (of main memory).

By having the digit lines of the memory sections 210(0)-210(3) of the redundant memory arrays 200 shorter in length than digit lines of the main memory array, the dimensions of the resulting redundant memory arrays 200 can be reduced in comparison to redundant memory arrays having digit lines the same length as in the main memory array. Such implementations may be desirable, for example, where space on a substrate on which the memory is formed is scarce or there is a desire to reduce the overall size of the memory. Additionally, using digit lines shorter in length than digit lines of memory sections of the main memory array may result in greater data margin for the sense-amplifiers because the shorter digit lines have lower impedance (e.g., capacitance).

In some embodiments, optional "dummy" digit lines 250 are formed in the memory sections of the redundant memory array. The dummy digit lines 250 are shown in FIG. 2 for only a portion of memory sections 210(0), 210(1). It will be appreciated by those ordinarily skilled in the art that dummy digit lines 250 may be formed for the entire memory section, and may be formed in each of the memory sections 210(0)-210(3). The dummy digit lines 250 are formed to extend into regions between the digit lines coupled to the sense amplifiers 220(0), 220(1). The dummy digit lines 250 provide a shield for noise immunity. In some embodiments, the dummy digit lines 250 may be biased to a voltage, such as one-half of a power supply voltage, to provide further noise immunity.

Figure 1:
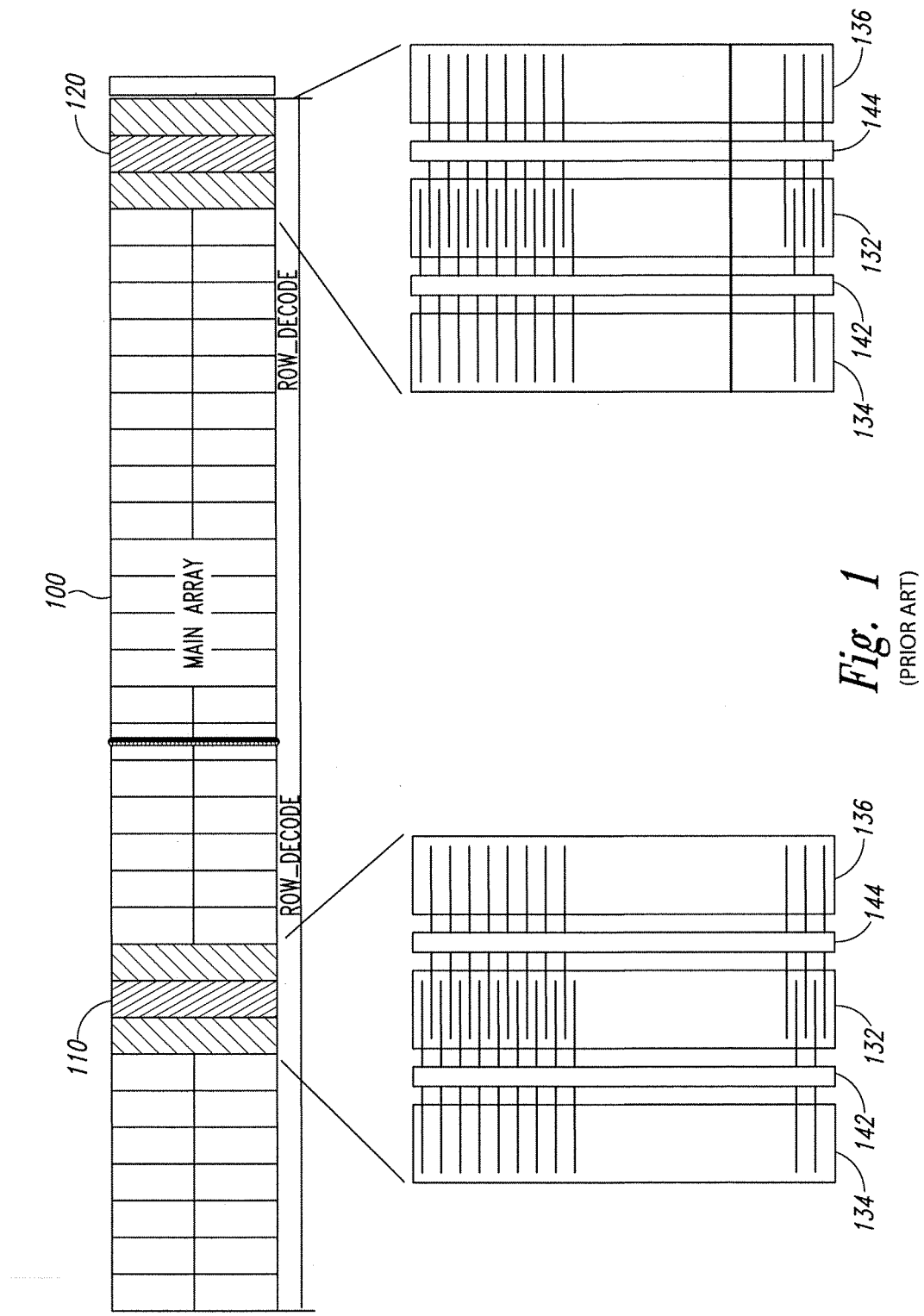
FIG. 1 is a block diagram of a portion of a conventional main memory array having an open-digit line sense-amplifier architecture.
Figure 3:
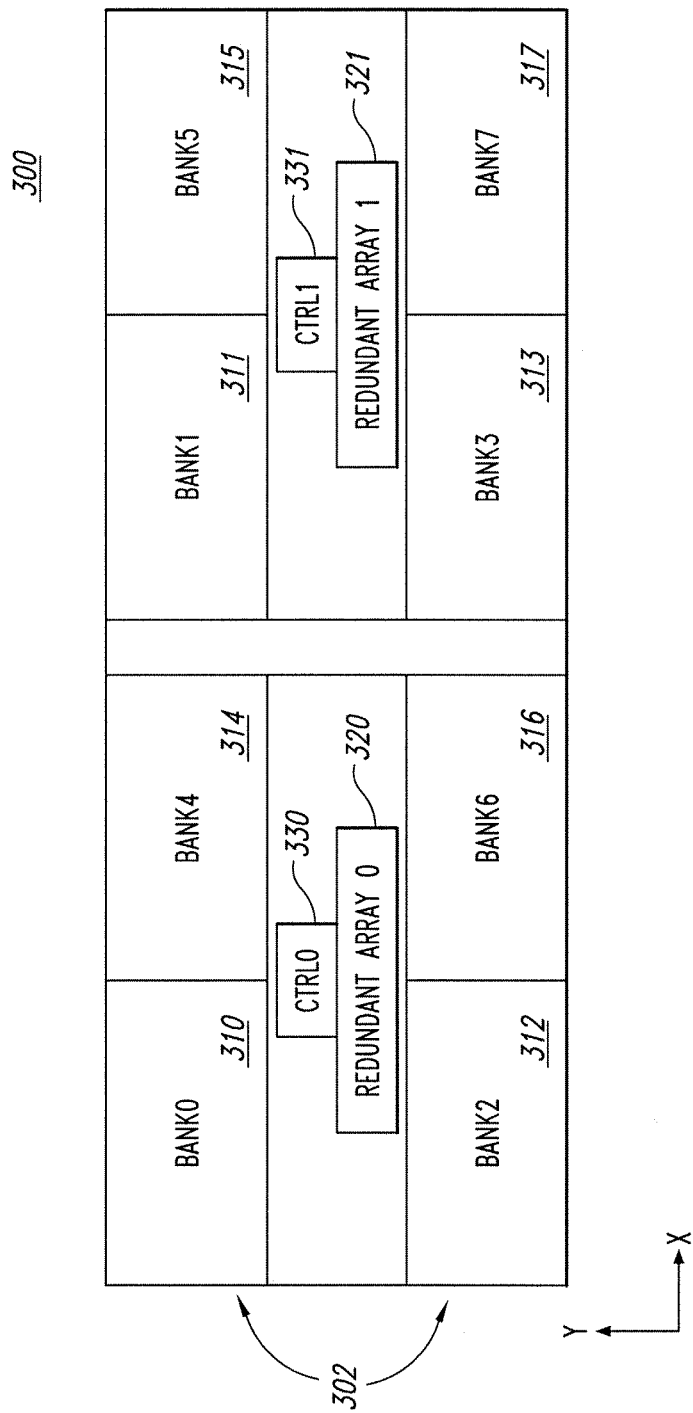
FIG. 3 is a block diagram of a main memory array and redundant memory arrays according to some embodiments of the invention.

FIG. 3 illustrates a portion of memory having a main memory array 302 divided into eight banks of memory 310-317. Each of the banks of memory 310-317 are further divided into memory sections (not shown). The redundant memory arrays 320, 321 include memory sections (not shown) to which memory sections of the main memory array 302 can be mapped for replacement. That is, memory addresses for the memory of a memory section of main memory are mapped to memory of the memory sections of the redundant memory arrays 320, 321. Redundant memory array logic circuits 330, 331 control the mapping of memory sections of main memory to the redundant memory arrays 320, 321. In some embodiments, sense amplifiers (not shown) for the main memory array 302 and the redundant memory array 320, 321 have open-digit line architectures. Each of the digit lines for the main memory array 302 extend into a memory section of the main memory array 302, such as illustrated in FIG. 1, and the digit lines for the redundant memory arrays 320, 321 extend into a memory section of the redundant memory arrays 320, 321.

The digit lines coupled to the sense-amplifiers for the redundant memory arrays 320, 321 may be coupled to fewer memory cells (i.e., shorter in length) than the digit lines coupled to the sense-amplifiers for the main memory array 302. In some embodiments, the digit lines for the redundant memory arrays 320, 321 are half the length of the digit lines for the main memory array 302. As previously discussed, utilizing redundant memory arrays having shorter digit lines than the memory sections of the main memory array can reduce the dimensions of a memory while still providing repairability for block failures, such as a block failure of three adjacent memory sections of the main memory array. For example, in embodiments having redundant memory array digit lines shorter in length than the digit lines for the main memory array 302, the memory may have a smaller dimension along the y-axis (FIG. 3) than for a memory having redundant memory array digit lines the same length as the digit lines for the main memory array 302.

In some embodiments of the invention having redundant memory arrays 320, 321 with digit lines half the length of the digit lines of the main array, each of the redundant memory arrays 320, 321 are divided into four memory sections and have two sets of sense-amplifiers, a first set shared by two of the memory sections and a second set shared by the other two memory sections. An example of a redundant memory array having such an arrangement was previously described with reference to FIG. 2. Both redundant memory arrays 320, 321 are used to replace a block failure of three adjacent memory sections of the main memory array. For example, two of the memory sections of the redundant memory arrays 320, 321 are used to fully replace one set of digit lines coupled to a set of sense-amplifiers of the main memory array. With reference to FIG. 1, there are four sets of digit lines coupled to the two sets of sense-amplifiers 142, 144 for a block failure of three adjacent memory sections of the main memory array. In particular, a first set coupled to the set of sense-amplifiers 142 extends into the first adjacent memory section 134, a second set coupled to the set of sense-amplifiers 142 extends into the central memory section 132, a third set coupled to the set of sense-amplifiers 144 extends into the central memory section 132, and a fourth set coupled to the set of sense-amplifiers 144 extends into the second adjacent memory section 136. Thus, a total of eight memory sections of the redundant memory arrays (as previously discussed, two memory sections of a redundant memory are used to fully replace one set of digit lines of the main memory array) are used to repair the four sets of digit lines (three adjacent memory sections) of the main memory array. For example, where both redundant memory arrays 320, 321 have an arrangement of memory sections as that shown in FIG. 2, memory sections 210(0), 210(1) of redundant memory array 320 may be used to replace the first adjacent memory section 134 (FIG. 1), memory sections 210(2), 210(3) of the redundant memory array 320 and memory sections 210(0), 210(1) of the redundant memory array 321 may be used to replace the central memory section 132, and memory sections 210(2), 210(3) of the redundant memory array 321 may be used to replace the second adjacent memory section 136.

Figure 4:
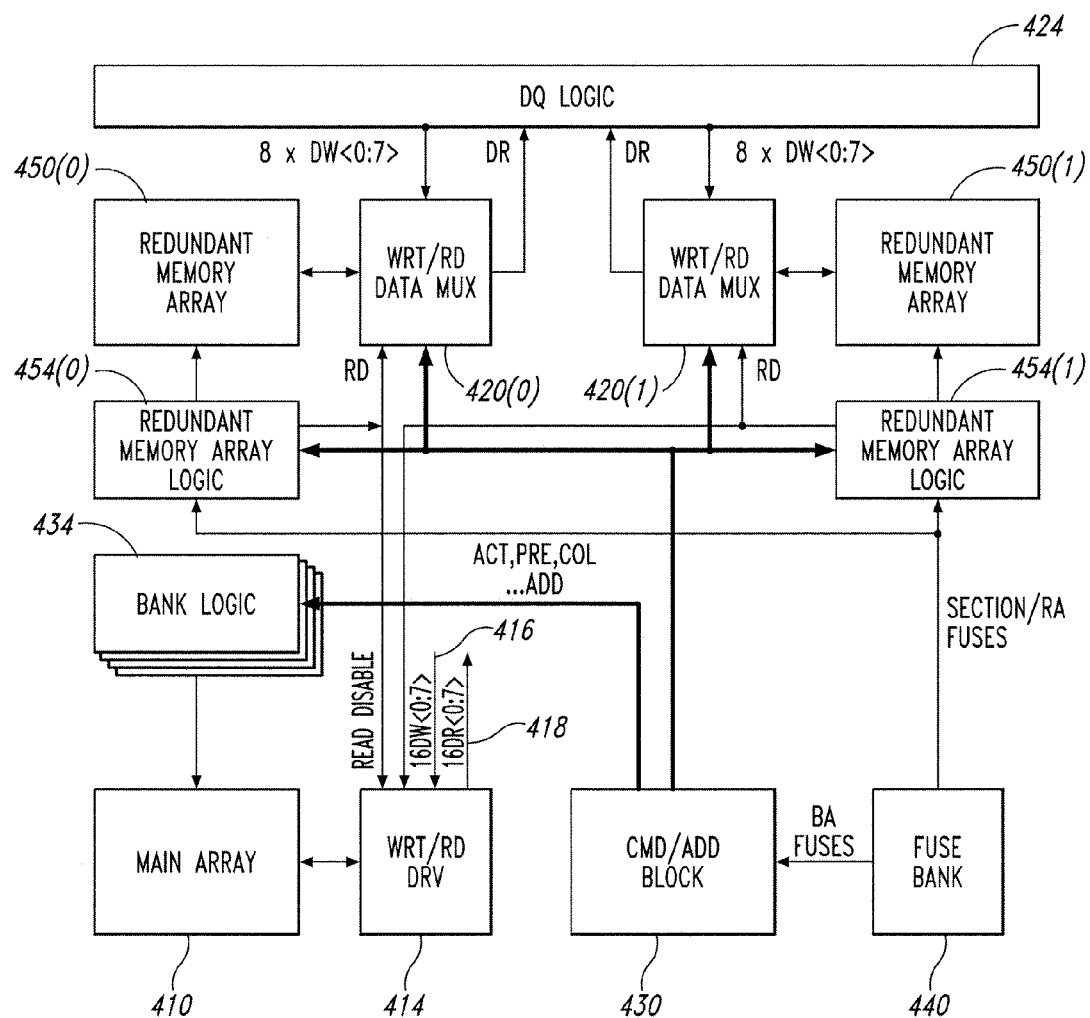
FIG. 4 is a block diagram of a portion of a memory according to some embodiments of the invention having redundant memory arrays.

FIG. 4 illustrates a portion of a memory according to some embodiments of the invention. The memory includes a main memory array 410, which is divided into several banks of memory (not shown in FIG. 4). The banks of memory are further divided into memory sections (not shown). The main memory array 410 is coupled to write/read driver circuit 414 that receives read data from the main memory array 410 and provides write data to the main memory array 410. The write/read driver circuits 414 are coupled to write/read data multiplexers 420(0), 420(1) through read and write data busses 416, 418, respectively. The data multiplexers 420(0), 420(1) selectively couple the read or write data busses 416, 418 to data input/output logic 424 in accordance with control signals generated by the command/address circuits 430. The command/address circuits 430 generate internal control signals to execute various memory operations, for example, read and write operations, in response to receiving external commands. In response to external addresses, the command/address circuits 430 generate internal address signals that are provided to, among other things, bank logic 434 to select the memory to be accessed. The bank logic 434 receives a portion of the internal address signals related to a bank address and generates signals for selecting the corresponding bank of memory of the main memory array 410.

A fuse bank of programmable fuses and fuse decoder circuits 440 is included in the memory for identification of memory address of memory of the main array 410 that are mapped to redundant memory, for example, redundant memory arrays 450(0), 450(1). As previously discussed, the memory typically includes other redundant memory in addition to the redundant memory arrays 450(0), 450(1). However, as also previously discussed, the other redundant memory is typically limited and local to respective memory sections, and is inadequate to replace all the memory of a memory section. As known, memory addresses to be mapped to redundant memory are programmed in the fuses and the fuse decoder circuits interprets the programmed fuses to generate the appropriate internal signals to direct memory access to redundant memory rather than to the main memory array 410. The fuse bank 440 includes programmable fuses that can be programmed to identify memory sections of the main memory array 410 that are mapped to memory sections of the redundant memory arrays 450(0), 450(1). As shown in FIG. 4, the programmable fuses and fuse decoder provide internal signals related to bank addresses to the command/address circuits 430 for identification of bank addresses that are mapped to redundant memory and further provide internal signals identifying memory sections of the main memory array 410 that have been remapped to memory sections of the redundant memory arrays 450(0), 450(1).

Although the redundant memory arrays 450(0), 450(1) may be used to replace entire sections of the main memory array 410 when entire sections are found to be defective, the redundant memory arrays 450(0), 450(1) may be used more generally to replace an entire section of the main memory array 410 where there is less than the entire section is failing. For example, where local redundant memory for a memory section of the main memory array 410 has been exhausted, but a single bit failure remains to be repaired, a redundant memory section of the redundant memory arrays 450(0), 450(1) can be used to replace that entire memory section of the main memory array 410 to salvage the memory. As a result, although the replaced memory section of the main memory array 410 may have the majority of its memory cells functional, a memory section of the redundant memory arrays 450(0), 450(1) can nevertheless be used to replace that memory section of the main memory array 410 if necessary to salvage the entire memory.

The internal signals identifying the mapped memory sections of the main memory array 410 are provided to redundant memory array logic 454(0), 454(1). The redundant memory array logic 454(0), 454(1) further receives internal control signals from the command circuits 440 for enabling access to the redundant memory arrays 450(0), 450(1) when the address for a memory location to be accessed matches bank addresses programmed in the programmable fuses 440. Additional internal control signals are provided to the write/read multiplexers 420(0), 420(1) to control coupling of the data input/output logic 424 to the main memory array (through write and read busses 416, 418) or the respective redundant memory array 450(0), 450(1). In particular, where memory of a replaced memory section identified by programmed programmable elements in the fuse bank 440 is to be accessed, the multiplexers 420(0), 420(1) are controlled to couple the redundant memory section that is replacing the main memory section to the data input/output logic. By coupling the designated redundant memory section to the data input/output logic 424 rather than the replaced main memory section, the redundant memory section is accessed instead.

Figure 5:
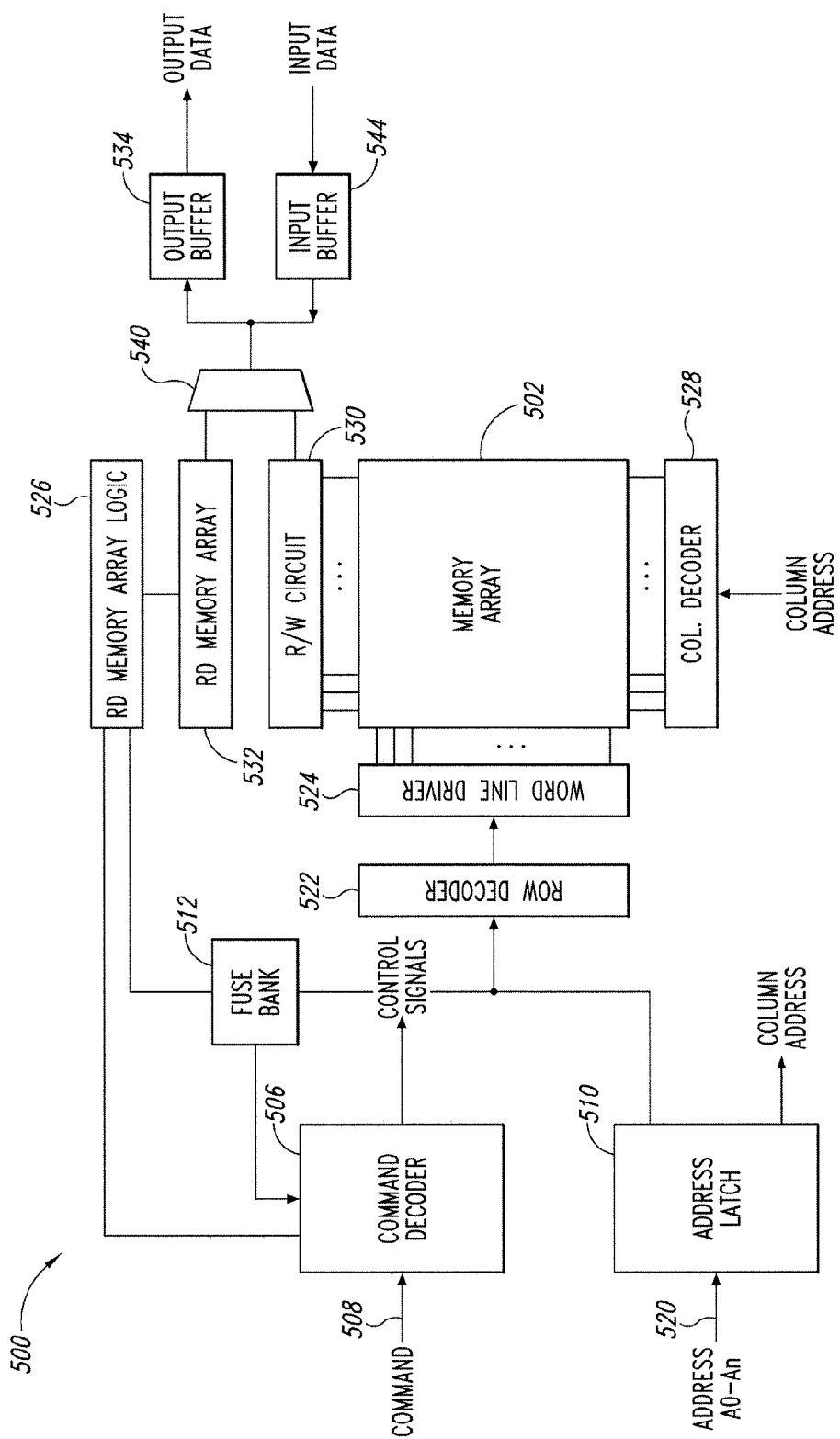
FIG. 5 is a block diagram of a memory system in which a redundant memory architecture according to an embodiment of the invention may be implemented.

FIG. 5 illustrates a portion of a memory 500 in which a redundant memory architecture according to an embodiment of the invention may be implemented. For example, embodiments as shown in FIG. 4 can be integrated with the elements of the memory 500 to provide replacement of memory sections of a main memory array with memory sections of a redundant memory array. The memory 500 includes a main memory array 502 of memory cells, which may be, for example, DRAM memory cells, SRAM memory cells, flash memory cells, or some other types of memory cells. The memory 500 includes a command decoder 506 that receives memory commands through a command bus 508 and generates corresponding control signals within the memory 500 to carry out various memory operations.

The memory 500 further includes a redundant memory array 532 having memory sections (not shown) and a redundant memory array logic circuit 526. A data multiplexer 540 is coupled to the redundant memory array 532 to provide access thereto when appropriate. In particular, when memory to be accessed corresponds to a memory section of the main memory array 502 has been replaced by a memory section of the redundant memory array 532. A fuse bank 512 includes programmable elements that are programmed to identify the main memory sections that have been replaced by memory sections of the redundant memory array 532.

Row and column address signals are applied to the memory 500 through an address bus 520 and provided to an address latch 510. The address latch then outputs a separate column address and a separate row address. The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a main portion of memory including first digit lines; and
   a plurality of redundant memory sections sharing a set of sense amplifiers, wherein individual ones of the set of sense amplifiers are coupled to second digit lines, wherein the second digit lines are shorter than the first digit lines.

2. The apparatus of claim 1, wherein the first digit lines are coupled to a first number of memory cells and the second digit lines are coupled to a second number of memory cells different than the first number.

3. The apparatus of claim 1, wherein the main portion of memory is larger than the plurality of redundant memory sections.

4. The apparatus of claim 1, wherein the plurality of redundant memory sections comprises a portion of memory having an open digit line architecture.

5. The apparatus of claim 1, further comprising:
   a fuse bank configured to map an address of the main portion of memory to one of the plurality of redundant memory sections.

6. The apparatus of claim 1, wherein one of the second digit lines is configured to provide noise immunity.

7. The apparatus of claim 1, a switch coupled to data input/output logic and configured to selectively couple the data input/output logic to the main portion of memory or the second portion of memory based, at least in part, on a plurality of programmable elements.

8. An apparatus, comprising:
   a first portion of memory including a first number of memory cells and a plurality of digit lines having a first length; and
   a second portion of memory including a plurality of sections sharing a set of sense amplifiers, the second portion of memory further including a second number of memory cells different than the first number and a plurality of digit lines having a second length different from the first length.

9. The apparatus of claim 8, wherein the second portion of memory includes a plurality of dummy digit lines.

10. The apparatus of claim 8, further comprising:
    a plurality of programmable elements configured to map a section of the first portion of memory to a section of the plurality of sections.

11. The apparatus of claim 8, further comprising:
    wherein the first portion of memory has a first set of dimensions and the second portion of memory has a second set of dimension, the first set of dimensions greater than the second set of dimensions.

12. The apparatus of claim 8, wherein the second portion of memory is smaller than the first portion of memory.

13. A method, comprising:
    mapping memory addresses of a main memory section to a first portion of memory including a first plurality of sections sharing a first set of sense amplifiers; and
    mapping memory addresses of the main memory section to a second portion of memory including a second plurality of sections sharing a second set of sense amplifiers.

14. The method of claim 13, wherein mapping memory addresses of a main memory section to a first portion of memory including a first plurality of sections sharing a first set of sense amplifiers comprises mapping an entire section of main memory to a redundant portion of memory.

15. The method of claim 14, wherein mapping an entire section of main memory to a redundant portion of memory comprises mapping an entire section of main memory to a plurality of redundant sections of memory.

16. The method of claim 13, wherein mapping memory addresses of a main memory section to a first portion of memory including a first plurality of sections sharing a first set of sense amplifiers comprises programming a plurality of programmable elements.

17. The method of claim 13, wherein mapping memory addresses of a main memory section to a first portion of memory including a first plurality of sections sharing a first set of sense amplifiers comprises selectively coupling data input/output logic to the first portion of memory.

18. The method of claim 13, wherein mapping memory addresses of the main memory section to a second portion of memory including a second plurality of sections sharing a second set of sense amplifiers comprises mapping memory addresses of a portion of memory having first dimensions to a portion of memory having second dimensions, the first dimensions larger than the second dimensions.

19. The method of claim 13, further comprising:
    shielding a sense amplifier of the first set of sense amplifiers.

20. The method of claim 19, wherein shielding a sense amplifier of the first set of sense amplifiers comprises biasing a dummy digit line.

* * * * *

UNITED STATES PATENT AND TRADEMARK OFFICE
CERTIFICATE OF CORRECTION

PATENT NO. : 8,582,377 B2
APPLICATION NO. : 13/888120
DATED : November 12, 2013
INVENTOR(S) : Yoshinori Fujiwara It is certified that error appears in the above-identified patent and that said Letters Patent is hereby corrected as shown below:

In the Specification:

In column 1, line 9, delete "Apr. 2, 2012," and insert -- Mar. 26, 2012, --, therefor.

Signed and Sealed this
Eighteenth Day of February, 2014

Michelle K. Lee
*Deputy Director of the United States Patent and Trademark Office*